(12) United States Patent
Park

(10) Patent No.: US 11,010,234 B2
(45) Date of Patent: May 18, 2021

(54) MEMORY DEVICE AND ERROR DETECTION METHOD THEREOF

(71) Applicant: Winbond Electronics Corp., Taichung (TW)

(72) Inventor: San-Ha Park, Taichung (TW)

(73) Assignee: Winbond Electronics Corp., Taichung (TW)

( * ) Notice: Subject to any disclaimer, the term of this patent is extended or adjusted under 35 U.S.C. 154(b) by 212 days.

(21) Appl. No.: 16/264,688

(22) Filed: Feb. 1, 2019

(65) Prior Publication Data

US 2020/0250021 A1    Aug. 6, 2020

(51) Int. Cl.
*G06F 11/00* (2006.01)
*G06F 11/07* (2006.01)
*G11C 11/4093* (2006.01)

(52) U.S. Cl.
CPC ........ *G06F 11/079* (2013.01); *G06F 11/0727* (2013.01); *G06F 11/0751* (2013.01); *G11C 11/4093* (2013.01)

(58) Field of Classification Search
CPC ............... G06F 11/079; G06F 11/0727; G06F 11/0751; G06F 11/1608; G06F 11/167; G06F 11/1666; G06F 11/2056
See application file for complete search history.

(56) References Cited

U.S. PATENT DOCUMENTS

| | | | | |
|---|---|---|---|---|
| 5,619,642 A * | 4/1997 | Nielson | ............... | G06F 11/1076 714/42 |
| 7,444,540 B2 * | 10/2008 | Shaw | ...................... | G06F 11/10 714/42 |
| 8,738,976 B2 * | 5/2014 | Nakano | ................... | G11C 29/56 714/719 |
| 9,665,430 B2 | 5/2017 | Tsern et al. | | |
| 9,704,563 B2 | 7/2017 | Bains et al. | | |
| 10,528,439 B2 * | 1/2020 | Ahn | ...................... | G06F 11/2071 |
| 2005/0278494 A1 * | 12/2005 | Hillier, III | .......... | G06F 11/1666 711/162 |
| 2014/0052906 A1 | 2/2014 | Thyagarajan et al. | | |

(Continued)

FOREIGN PATENT DOCUMENTS

| | | |
|---|---|---|
| CN | 103854705 | 6/2014 |
| TW | I501251 | 9/2015 |

OTHER PUBLICATIONS

Jason D. Hiser et al., "MEDS: The Memory Error Detection System," Engineering Secure Software and Systems, LNCS, vol. 5429, Feb. 2009, pp. 1-15.

(Continued)

*Primary Examiner* — Philip Guyton
(74) *Attorney, Agent, or Firm* — JCIPRNET

(57) ABSTRACT

A memory device includes a memory array having at least one memory bank, where the at least one memory bank includes a target memory array and a clone memory array. The clone memory array corresponds to the target memory array and is configured to store the same data as in the target memory array. When a command that is applied to the target memory array to perform an operation, the command is also applied to the clone memory array. An error detection method adapted to a memory device having at least one memory bank that comprises a target memory array and a clone memory array is also introduced.

14 Claims, 10 Drawing Sheets

(56) References Cited

U.S. PATENT DOCUMENTS

2015/0309862 A1* 10/2015 Han ................... G06F 12/0893
  714/801
2019/0042097 A1 2/2019 Radtke et al.

OTHER PUBLICATIONS

Wookhyun Han et al., "Enhancing Memory Error Detection for Large-Scale Applications and Fuzz Testing," Network and Distributed Systems Security, Feb. 18-21, 2018 pp. 1-15.
"Office Action of Taiwan Counterpart Application", dated Dec. 6, 2019, pp. 1-6.

* cited by examiner

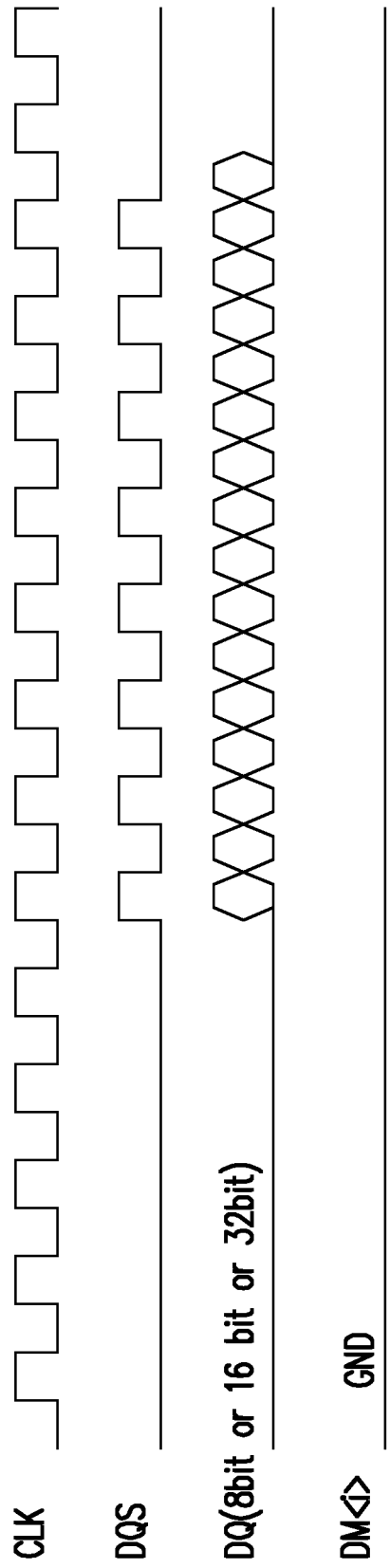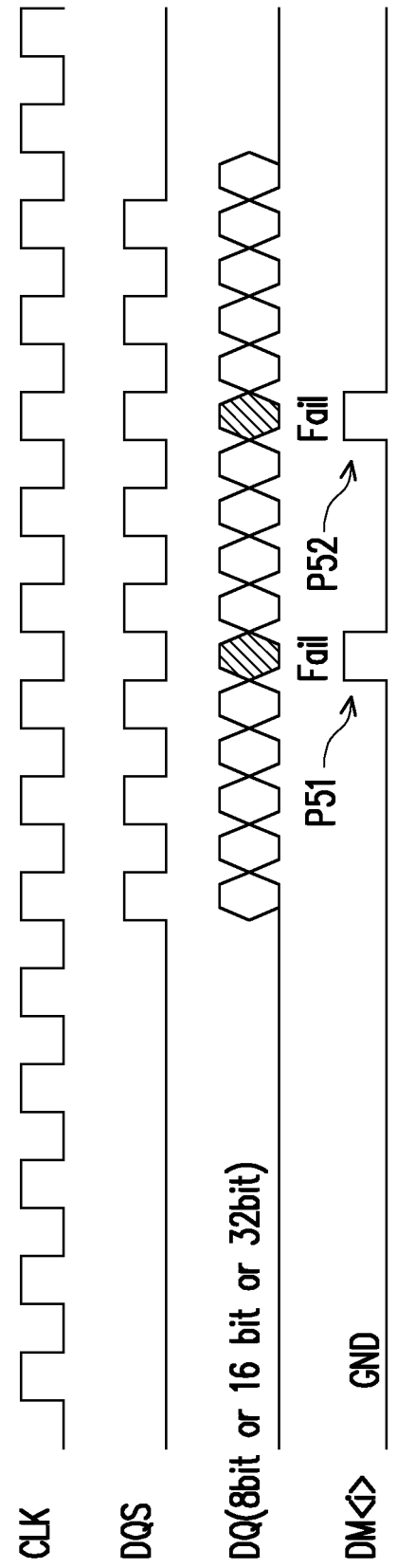

MEMORY DEVICE AND ERROR DETECTION METHOD THEREOF

BACKGROUND OF THE INVENTION

1. Field of the Invention

The invention relates to a memory device and an error detection method for detecting errors or failures on the memory device.

2. Description of Related Art

Memory devices, especially Random Access Memory (RAM) and Dynamic Random Access Memory (DRAM) devices are applied to a wide ranges of applications, such as automotive vehicles, computers, digital cameras, smartphones, and the like. For high reliability system, it requires highly reliable memory devices that may detect errors or failures that may occur to the memory device. Typically, an error correction code (ECC) is used to detect an error bit and correct the detected error bit. However, ECC does not work well with the multi error bits that may be caused by a number of failures such as word line failure, cell-to-cell failure, lumped particle failure, bitline-to-bitline short, and so on. In such situations, the ECC is unable to correct the errors or failures, and the system cannot recognize the existence of the failures. As a result, a reliability of the memory device is reduced.

Along with the popularity of memory devices, it is desirable to have a memory device that has a reliable error detection scheme, thereby improving the performance and reliability of the memory device.

SUMMARY OF THE INVENTION

This invention introduces a memory device and an error detection method for detecting errors in the memory device.

The memory device includes a memory array having at least one memory bank, where the at least one memory bank includes a target memory array and a clone memory array corresponding to the target memory array. The target memory array is configured to store data, and the clone memory array is configured to store the same data as the target memory array. A command that is applied to the target memory array to perform an operation is applied to the clone memory array.

The error detection method is adapted to a memory device having at least one memory bank that comprises a target memory array and a clone memory array. The reading error detection comprising steps of reading a target memory cell of the target memory array to obtain target memory data; reading a clone memory cell of the clone memory array to obtain clone memory data, wherein the clone memory cell of the clone memory array corresponds to the target memory cell of the target memory array; comparing the target memory data with the clone memory data to output a comparison signal; and determining whether the target memory data include an error according to the comparison signal.

In embodiments of the invention, the clone memory array is configured to store the same data as in the target memory array, as such the error detection method may compare the data stored in the target memory array and the data stored in the clone memory array to detect an error in the memory device. In this way, reliability of data stored in the memory device is improved.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5A to FIG. 5B are waveform diagrams illustrating signals in the memory device when a data bus inversion algorithm is disabled according to an embodiment of the invention.

DESCRIPTION OF THE EMBODIMENTS

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
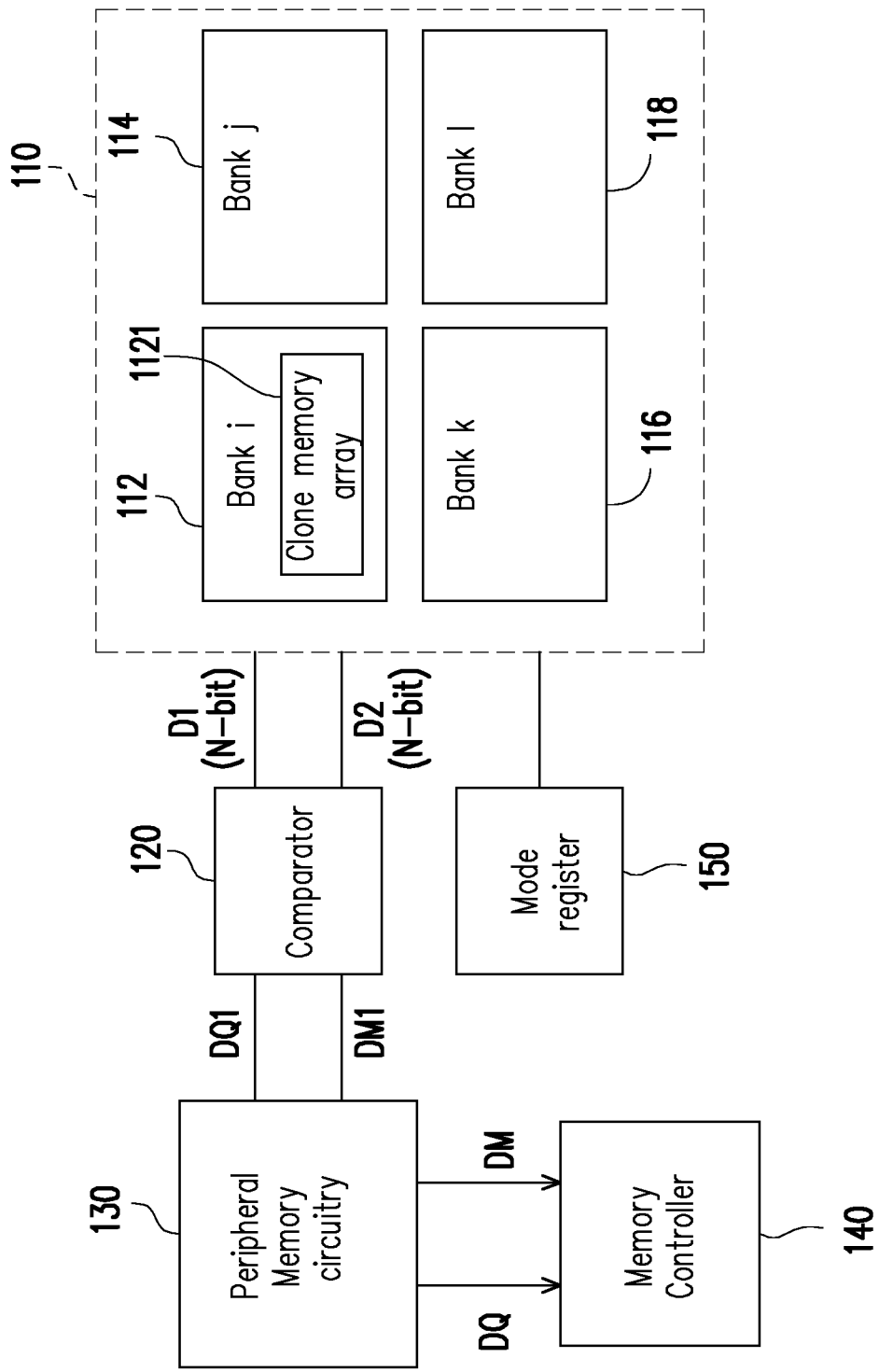
FIG. 1 is a schematic diagram illustrating a memory device according to an embodiment of the invention.

Referring to FIG. 1, a memory device 100 includes a memory array 110, a comparator 120, a periphery memory circuitry 130, a memory controller 140 and a mode register 150. The memory array 110 include memory banks 112, 114, 116 and 118 (also referred to as bank i, bank j, bank k and bank 1, respectively). At least one of the memory banks 112, 114, 116 and 118 include a clone memory array 1121 which corresponds to a target memory array (not shown) located in the memory array 110. The clone memory array 1121 stores the same data being stored in the target memory array. As shown in FIG. 1, the clone memory array 1121 is located in the bank 112 (bank i) of the memory array 110, but the invention is not limited thereto. The clone memory array 1121 may be located in any of the memory banks 112, 114, 116 and 118 of the memory array 110.

In an embodiment of the invention, the memory device 100 is a Dynamic Random Access Memory (DRAM)

device, and the memory device 100 is compatible with Joint Electron Device Engineering Council (JEDEC) standard.

The comparator 120 is coupled to the memory array 110 and is configured to compare data read from the memory array 110. As an example, the comparator 120 may compare target memory data D1 and clone memory data D2, where the target memory data D1 is read from the target memory array and the clone memory data D2 is read from the clone memory array. As shown in FIG. 1, the comparator 120 is a separated circuit, but the comparator 120 may also be integrated into other circuits of the memory device 110. The comparator 120 outputs a data mask signal DM1 and a data output signal DQ1 to the peripheral memory circuitry 130.

The data mask signal DM1 may indicate whether the target memory data D1 is the same as the clone memory data D2, and the data output signal DQ1 may be the target memory data D1 or may be related to the target memory data D1. The target memory data D1 and the clone memory data D2 are N-bit data, where N is an integer such as 8, 16, 32, 64. The data D1 and D2 can be data being performed with an error correction code (ECC) operation or data read from the memory array 110 directly.

The peripheral memory circuitry 130 is coupled to the comparator 120 to receive the data mask signal DM1 and the data output signal DQ1 from the comparator 120. The peripheral memory circuitry 130 may output data mask signal DM and data output signal DQ to the memory controller 140. The data mask signal DM and the data output signal DQ are the same as or are related to the data mask signal DM1 and the data output signal DQ1, respectively.

The peripheral circuitry 130 includes circuits that are essential for the operation of the memory device 100. For example, the peripheral circuitry 130 may include row and column decoders (not shown), bit-line pre-charge circuits (not shown), sense amplifiers (not shown), timing controller (not shown) and read-write circuit (not shown) of the memory device 100. These circuits are essential for performing operations on the memory device 100, and the functions of these circuits are well understood by skilled people in the art, thus the detailed description about these circuits are omitted hereafter.

In an embodiment of the invention, the data mask signal DM is transmitted to a data mask pin (not shown) of the memory device 100, and the data output signal DQ is output to a data output pin (not shown) of the memory device 100. In another embodiment, the data mask signal DM and the data output signal DQ are transmitted to additional pins rather than the data mask pin and the data output pin of the memory device 100.

The memory controller 140 is coupled to the peripheral memory circuitry 130 to receive the data mask signal DM and the data output signal DQ from the peripheral memory circuitry 130. Based on the received data mask signal DM and the data output signal DQ, the controller 140 may determine whether the target memory data D1 stored in the memory array 110 contain an error. The memory 140 is also configured to control operations of the memory device 100 through commands.

The mode register 150 is configured to set a location and size of the target memory array and the clone memory array in the memory device 100. The target memory array and the clone memory array are located in the same bank or in different banks of the memory device 100. In addition, the size of the target memory array and the clone memory array is modified according to designed needs. The mode register 150 may also select bank address and row address to access cells in the target memory array and clone memory array.

The mode register 150 may also disable the function of the clone memory array, or disable the function of both clone memory array and the target memory array. In this way, the memory array 110 may be use as a conventional memory array. In addition to mode register 150, alternative circuits such as option fuse or internal wiring may be configured to select target memory array and clone memory array.

Figure 2B:
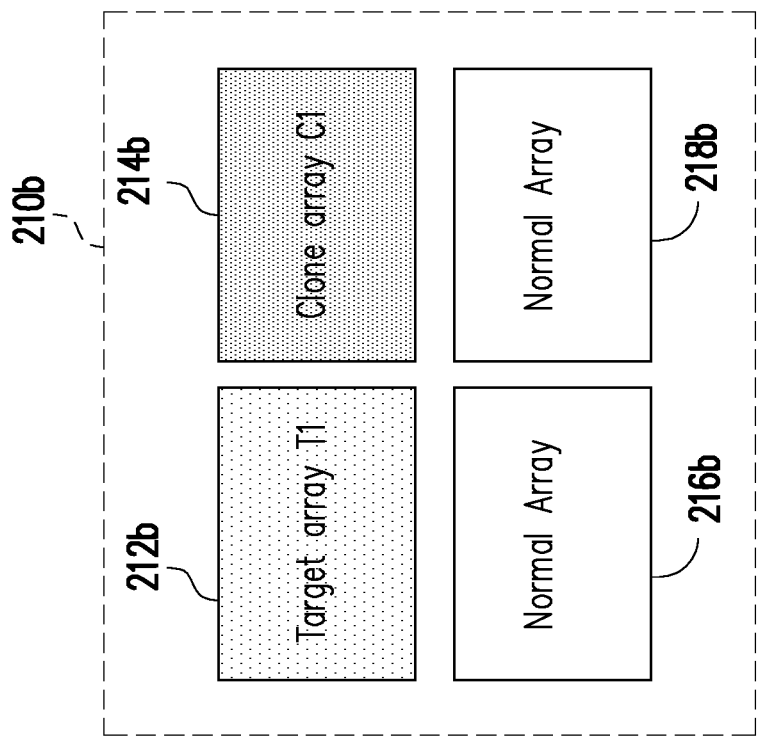
FIG. 2A to FIG. 3D are schematic diagrams illustrating a memory device having a target memory array and a clone memory array according to an embodiment of the invention.
Figure 2A:
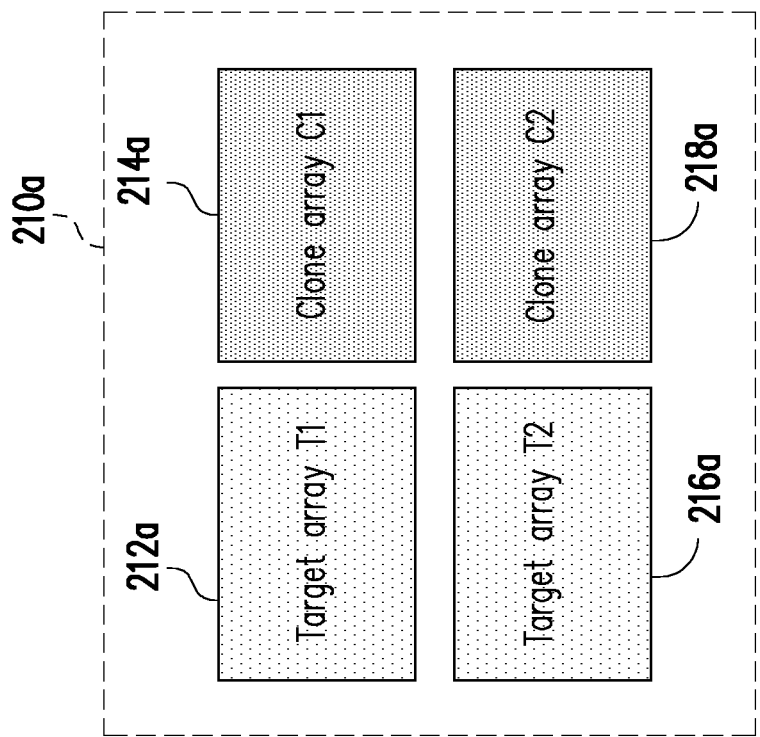
Figure 2C:
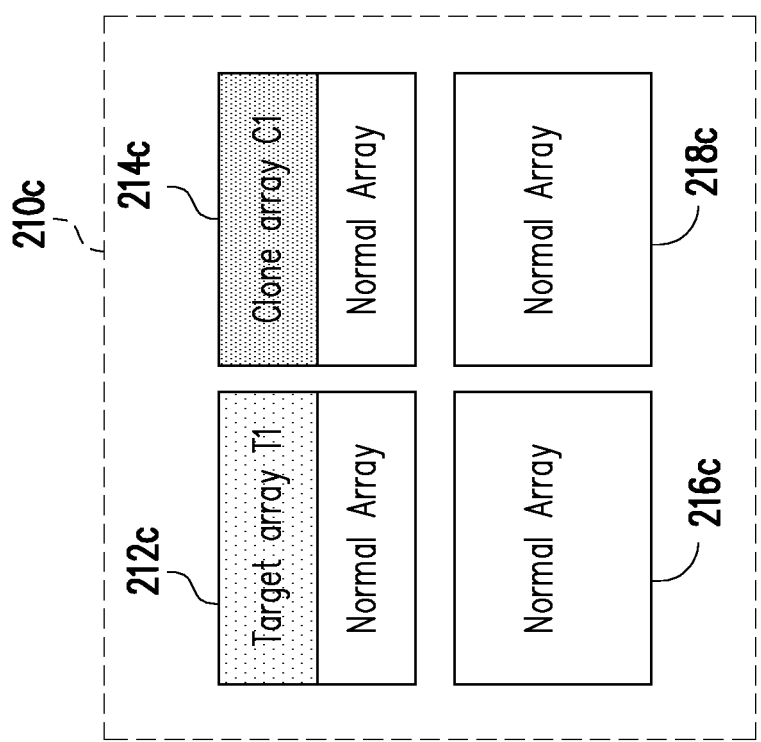

Referring to FIG. 2A to 2C, exemplary examples about a memory array including a target memory array and a clone memory array located in different memory banks are illustrated. Referring to FIG. 2A, a memory array 210a includes target memory arrays T1, T2 and clone memory arrays C1, C2, where the target memory array T1, T2 and the clone memory arrays are located in different banks.

Particularly, the memory array 210a includes a first target memory array T1 which is located in the memory bank 212a, a first clone memory array C1 which is located in the memory bank 214a, a second target array T2 which is located in the memory bank 216a, and a second clone memory array C2 which is located in the memory bank 218a. The first clone memory array C1 has the same size and stores the same data as the first target memory array T1. The second clone memory array C2 has the same size and store the same data as the second target memory array T2. The location, size, and access addresses of the clone memory arrays C1, C2 and the target memory arrays T1, T2 are controlled by the mode register 150 shown in FIG. 1. In FIG. 2A, the clone memory array C1 and C2 possess 50% of the memory banks 212a to 218a.

Referring to FIG. 2B, a memory array 210b includes a target memory array T1 which is located in the memory bank 212b and a clone memory array C1 which is located in the memory bank 214b. The clone memory array C1 has the same size and stores the same data as the target memory array T1. A difference between the memory array 210a shown in FIG. 2A and the memory array 210b shown in FIG. 2b is that the memory array 210b includes memory banks 216b and 218b which are normal memory banks. In other words, the normal memory banks 216b and 218b do not include any target memory array or clone memory array. In FIG. 2B, the clone memory array C1 possess 25% of the memory banks 212b to 218b.

Referring to FIG. 2C, a memory array 210c includes a target memory array T1 which is located in the memory bank 212c and a clone memory array C1 which is located in the memory bank 214c. A difference between the memory array 210c shown in FIG. 2C and the memory array 210b in FIG. 2B is that the size of the clone memory array and the target memory array in FIG. 2B is the same as the size of the banks, while the size of the clone memory array and the target memory array in FIG. 2C is smaller than the size of the banks. The memory bank 212c includes a target memory array T1 and a normal array, and the memory bank 214c includes a clone memory array C1 and a normal array. The clone memory array C1 possess 12.55% of the memory banks 212c to 218c.

FIG. 2A to FIG. 2C illustrates examples where the clone memory array possessing 50%, 25% and 12.5%. However, the invention is not limited thereto, and the ratio of the clone memory array over the total memory array can be adjusted according to the designed needs.

Figure 3B:
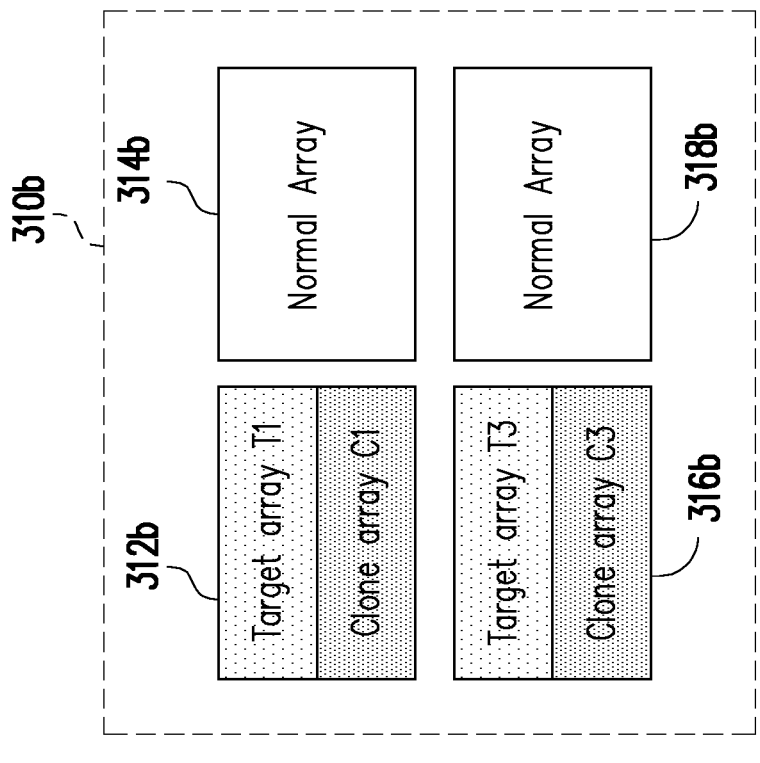
Figure 3A:
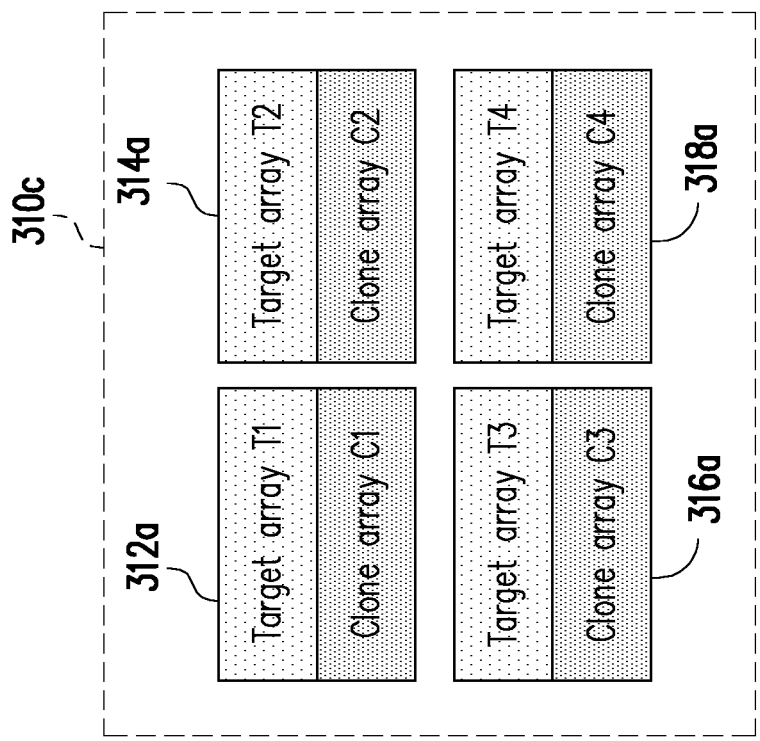

Referring to FIG. 3A to 3D, exemplary examples about a memory array including a target memory array and a clone memory array located in the same memory bank are illustrated. Referring to FIG. 3A, a memory array 310a includes memory banks 312a, 314a, 316a and 318a, where each of the memory banks 312a, 314a, 316a and 318a includes a target memory array and a clone memory array corresponding to the target memory array. Particularly, the memory bank 312a includes a target memory array T1 and a clone memory array C1 corresponding to the target memory array T1. The memory bank 314a includes a target memory array T2 and a clone memory array C2 corresponding to the target memory array T2. The memory bank 316a includes a target memory array T3 and a clone memory array C3 corresponding to the target memory array T3, and the memory bank 318a includes a target memory array T4 and a clone memory array C4 corresponding to the target memory array T4. In the example shown in FIG. 3A, the clone memory arrays C1, C2, C3 and C4 possess 50% of the memory banks 312a to 318a.

Referring to FIG. 3B, a memory array 310b includes memory banks 312b, 314b, 316b and 318b, where each of the memory banks 312b and 316b includes a target memory array and a clone memory array corresponding to the target memory array. The memory banks 314b and 318b only include normal memory arrays. The memory bank 312b includes a target memory array T1 and a clone memory array C1 corresponding to the target memory array T1. The memory bank 316a includes a target memory array T3 and a clone memory array C3 corresponding to the target memory array T3. In the example shown in FIG. 3B, the clone memory arrays C1 and C3 possess 25% of the memory banks 312b to 318b.

Figure 3D:
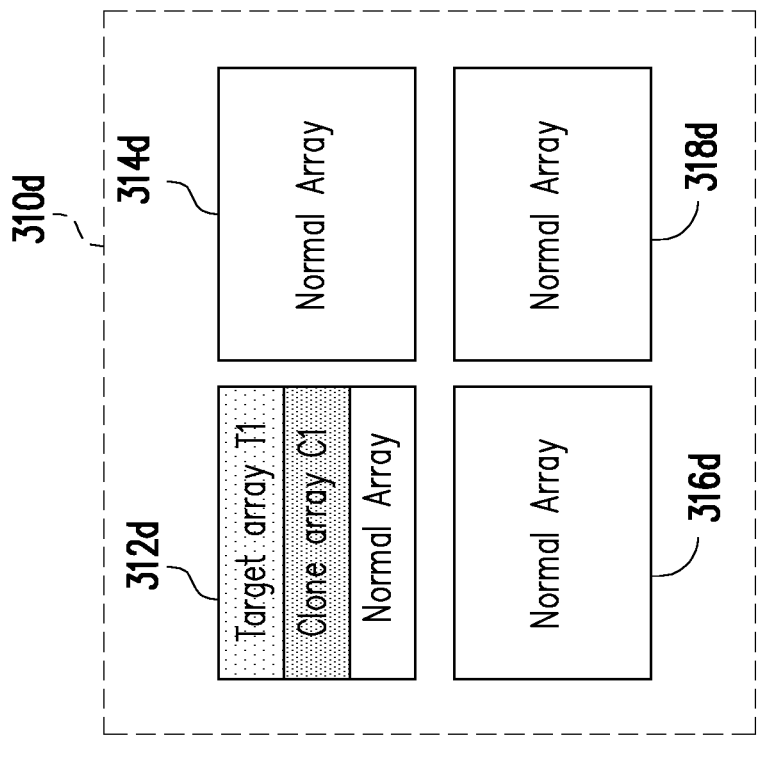
Figure 3C:
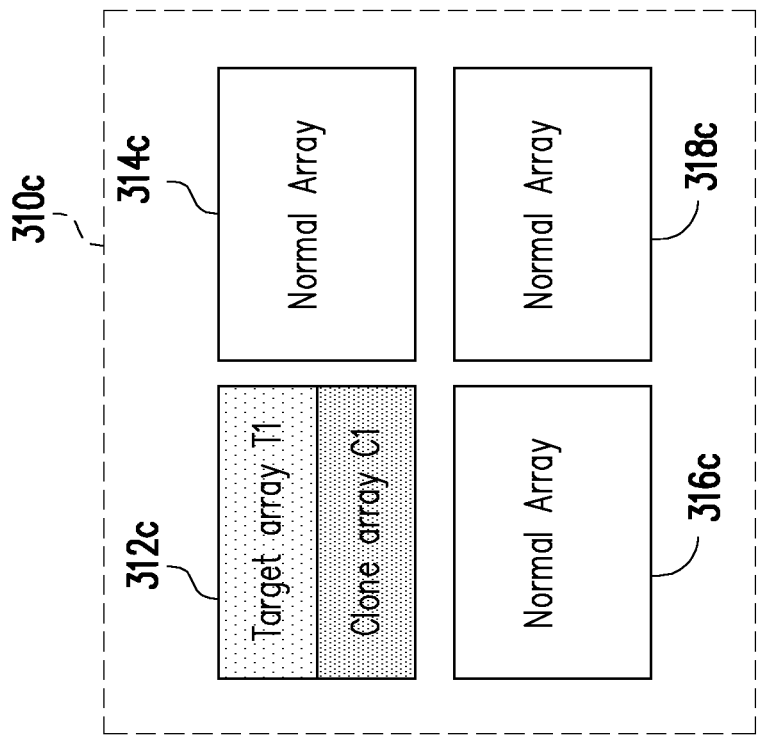

Referring to FIG. 3C, a memory array 310c includes memory banks 312c, 314c, 316c and 318c, where the memory bank 312c includes a target memory array T1 and a clone memory array C1 corresponding to the target memory array T1. The memory banks 314c, 316c and 318c only include normal memory arrays. In the example shown in FIG. 3C, the clone memory array C1 possess 12.5% of the memory banks 312c to 318c.

Referring to FIG. 3D, a memory array 310d includes memory banks 312d, 314d, 316d and 318d, where the memory bank 312d includes a target memory array T1 and a clone memory array C1 and a normal memory array. The memory banks 314d, 316d and 318d only include normal memory arrays. In the example shown in FIG. 3D, the clone memory array C1 possess 8.33% of the memory banks 312d to 318d.

Figure 4A:
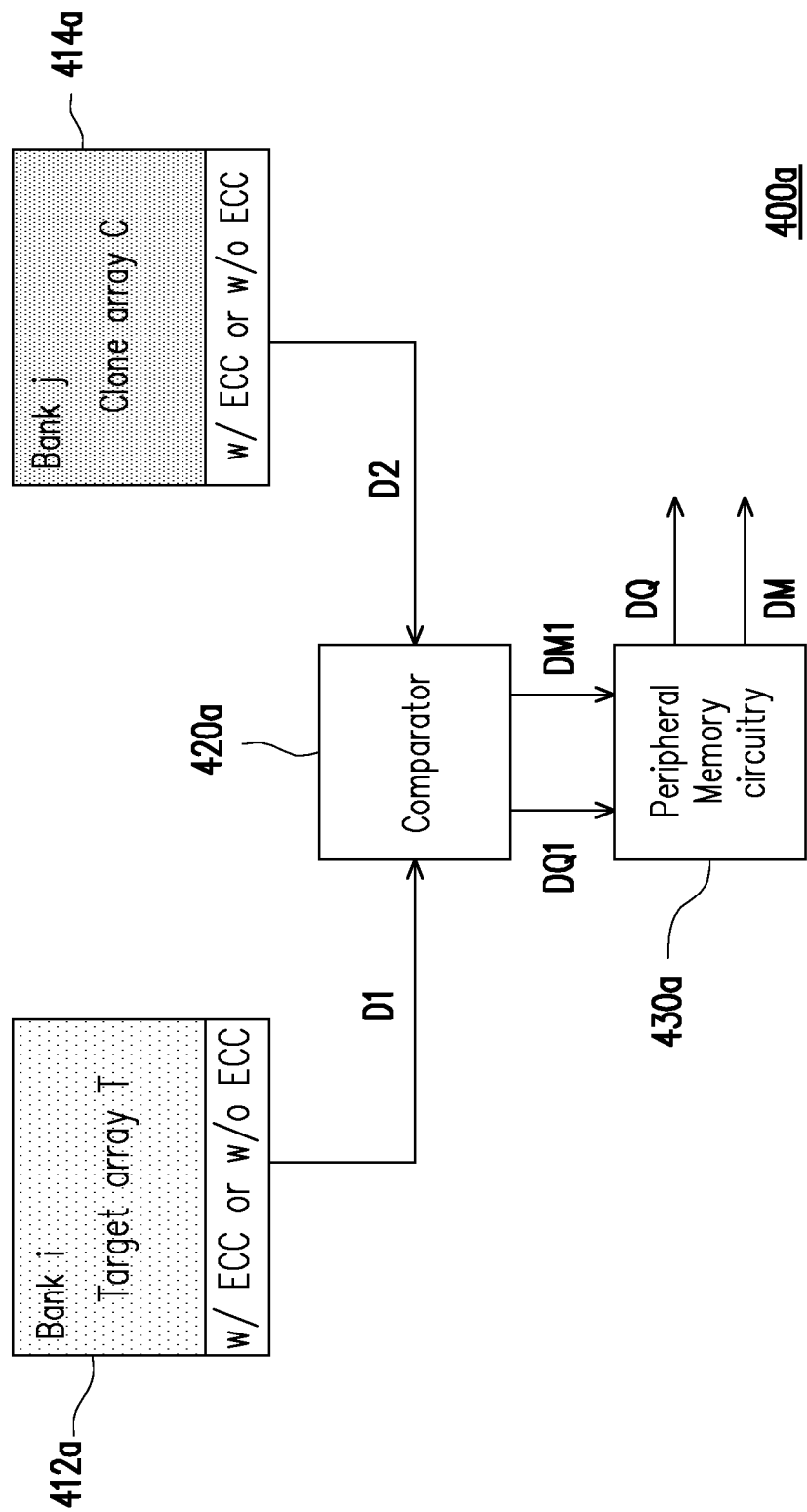
FIG. 4A is a schematic diagram illustrating a memory device having a target memory array and clone memory array located in different memory banks according to an embodiment of the invention.

Referring to FIG. 4A, a memory device 400a includes a memory bank 412a and a memory bank 414a, where the memory bank 412a include a target memory array T and the memory bank 414a includes a clone memory array C. The clone memory array C has the same size and store the same data as the target memory T.

The memory device 400a further includes a comparator 420a and the peripheral memory circuitry 430a. The comparator 420a is configured to compare data D1 and D2 to output the data mask signal DM1 and the data output signal DQ1. The data D1 and D2 may be data being performed with the EEC operation or the data being read directly from the target memory array 412a and the clone memory array 414a. The peripheral memory circuitry 430a is coupled to the comparator 420 and is configured to output a data mask signal DM and a data output signal DQ according to the received data mask signal DM1 and the data output signal DQ1.

In an operation of the memory device 400a, if a command is applied on the target control array T in the memory bank 412a, the same command is also applied to the clone memory array of the memory bank 414a.

For example, when the memory device 400a receives an active command and a write command for writing data into the target memory array T, both of the banks 412a and 414a are enabled. Selected target cells of the target memory array T and the corresponding clone cells of the clone memory array C are activated at the same time, such that the data are written into both of the target cells of the target memory array T and the corresponding clone cells of the clone memory array C.

If the active command and the write command is applied to write data on a normal memory array which is different from the target memory array T, only the memory bank containing the selected normal memory array is enabled. As such, the memory data are only written to the normal memory array.

In another example, when the memory device 400 receives a read command for read data stored in the target cells of the target memory array T, both of the banks 412a and 414a are enabled and the selected target cells in the target memory array T and the corresponding clone cells in the clone memory array C are activated at the same time. The read command is applied to target cells and the corresponding clone cells to obtain data D1 and D2. The data D1 and D2 may be performed with the ECC operation.

The data D1 and D2 (with or without ECC) is output to the comparator 420a, and comparator 420a compares the data D1 and D2 to determine whether the data D1 is the same as the data D2. If the data D1 and D2 are the same, the comparator 420a sets the data mask signal DM1 at a predetermined level (e.g., ground level), for indicating that there is no error in the data stored in the target memory array T and the clone memory array C. If the data D1 and D2 are different, the comparator 420a outputs a pulse on the data mask signal to indicate that there is an error of the data stored in the target memory array T and the clone memory array C. Accordingly, the data mask signal may be used to determine whether there is an error in the read data.

Table 1 and Table 2 shows examples of an error detection by comparing target data read from a target memory array of a memory bank<i> and clone data read from a corresponding clone memory array of a memory bank<j>. Each data bit of the target data is compared to a corresponding bit of the clone data. For example, Data0 of the target data is compared with Data0 of the corresponding clone data, Data1 of the target data is compared with Data1 of the corresponding clone data, and so on. There are 128 bits of the target data and clone data shown in Table 1 and Table 2, but the invention is not limited to any specific bit number of the data.

When the target data is the same as the corresponding clone data, a data mask signal DM outputs a first logic value (e.g., 0) for indicating that there is no error in the target data and the clone data. When the target data is different from the corresponding clone data, data mask signal DM outputs a second logic value (e.g., 1) for indicating that there is an error in the target data and the clone data.

TABLE 1

|  | Bank<i> | bank<j> | Compare result | DM<i> |
| --- | --- | --- | --- | --- |
| LDQ | Data0 | Data0 | Same | 0 |
|  | Data1 | Data1 | Same |  |
|  | Data2 | Data2 | Same |  |
|  | Data3 | Data3 | Same |  |
|  | Data4 | Data4 | Same |  |
|  | Data5 | Data5 | Same |  |
|  | — | — | Same |  |
|  | — | — | Same |  |

TABLE 1-continued

| | Bank\<i\> | bank\<j\> | Compare result | DM\<i\> |
|---|---|---|---|---|
| UDQ | — | — | Same | 0 |
| | — | — | Same | |
| | — | — | Same | |
| | Data123 | Data123 | Same | |
| | Data124 | Data124 | Same | |
| | Data125 | Data125 | Same | |
| | Data126 | Data125 | Same | |
| | Data127 | Data127 | Same | |

TABLE 2

| | Bank\<i\> | bank\<j\> | Compare result | DM\<i\> |
|---|---|---|---|---|
| LDQ | Data0 | Data0 | Same | 1 |
| | Data1 | Data1 | Same | |
| | Data2 | Data2 | Same | |
| | Data3 | Data3 | Different | |
| | Data4 | Data4 | Same | |
| | Data5 | Data5 | Same | |
| | — | — | Same | |
| | — | — | Same | |
| UDQ | — | — | Same | 0 |
| | — | — | Same | |
| | — | — | Same | |
| | Data123 | Data123 | Same | |
| | Data124 | Data124 | Same | |
| | Data125 | Bata125 | Same | |
| | Data126 | Data126 | Same | |
| | Data127 | Data127 | Same | |

Figure 4B:
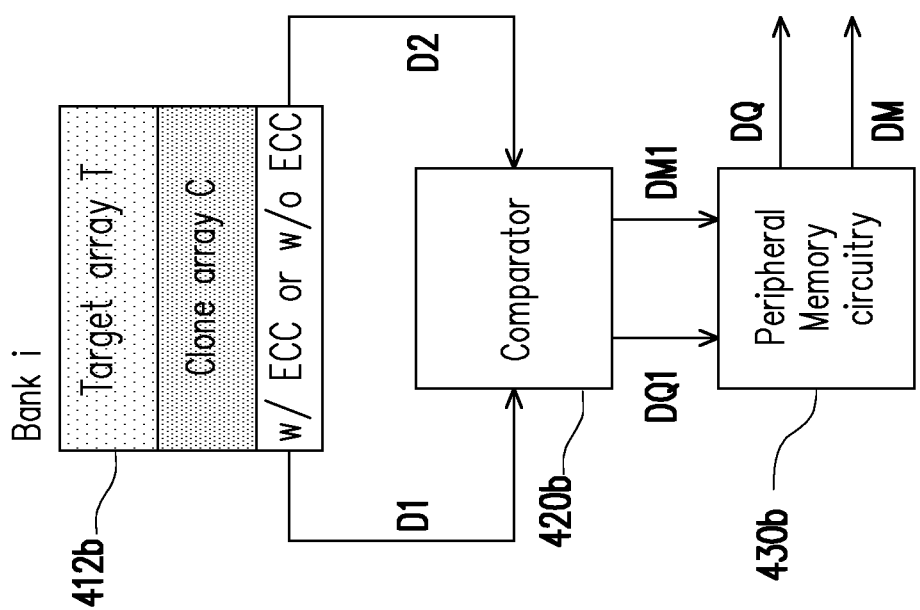
FIG. 4B is a schematic diagram illustrating a memory device having a target memory array and clone memory array located in a same memory bank according to an embodiment of the invention.

Referring to FIG. 4B, a memory device 400b includes a memory bank 412b, the comparator 420b and the peripheral memory circuitry 430, where the memory bank 412b includes a target memory array T and a clone memory array C corresponding to the target memory array T. In other words, both of target memory array T and the clone memory array C are located in the same memory bank 412b. The comparator 420b and the peripheral memory circuitry 430b shown in FIG. 4B are similar to the comparator 420a and the peripheral memory circuitry 430a shown in FIG. 4A, thus the detailed description about the comparator 420b and the peripheral memory circuitry 430b are omitted hereafter.

In operation, when an active command and a write command are applied to the target memory array T of the memory bank 412b, both of the target memory array T and the clone memory array C are enabled. Selected target cells of the target memory array T and the corresponding clone cells of the clone memory array C are activated at the same time. As such, the data to be written are written to both of the selected target cells of the target memory array T and the corresponding clone cells of the clone memory array C.

If the active command and the write command is applied to write data on a normal memory array which is different from the target memory array T, the clone memory array C is not activated, and the write command for normal array will not be applied for another memory array.

In another example, when the memory device 400 receives a read command for read data stored in selected target cells in the target memory array T, both of selected target cells in the target memory array T and the corresponding clone cells in the clone memory array C are activated at the same time. The read command is applied to target cells and the corresponding clone cells to obtain data D1 and D2. The data D1 and D2 (with or without ECC) is output to the comparator 420, and comparator 420a compares the data D1 and D2 to determine whether there is an error of the data stored in the target memory array T and the clone memory array C.

In some embodiments of the invention, a data bus inversion (DBI) algorithm may be enabled in the memory device so as to reduce the power consumption of the memory device. The DBI algorithm is configured to decide whether current data word is inverted or not based on a number of transitions of the current data word from the previously transmitted data word. Typically, if number of transitions of the current data word from the previously transmitted data word is greater than or equal to half of the bits of the current data, then the current data word is inverted. For example, if the data word is 8-bits data, the current data word will be inverted when the number of transitions of the current data word from the previously transmitted data word is greater than or equal to four. In the DRAM memory device, the data mask signal is used to indicate whether a data word is inverted. Particularly, when the data mask signal has the logic value of "1", then the data word is inverted, and when the data mask signal has the logic value of "0", then the data word is not inverted.

FIG. 5A and FIG. 5B illustrate signal waveforms in the memory device when the DBI algorithm is disabled. The illustrated signals include a clock signal CLK, a data output stroke signal DQS, data output signal DQ and the data mask signal DM. When the DBI algorithm is disabled, the data mask signal DM alone can be used to determine whether there is an error from the data read from the target memory array.

As shown in FIG. 5A, if there is no error in the stored data, the data mask signal DM is output at a predetermined level (e.g., ground voltage level or logic "0"). As shown in FIG. 5B, when an error is detected in the stored data, a pulse is generated in the data mask signal DM. Pulses P51 and P52 that are generated on the data mask signal DM indicate that the data being read from the target memory array are erroneous. The erroneous data words of the read data may be determined according to the location of the pulse P51 and P52.

Figure 6A:
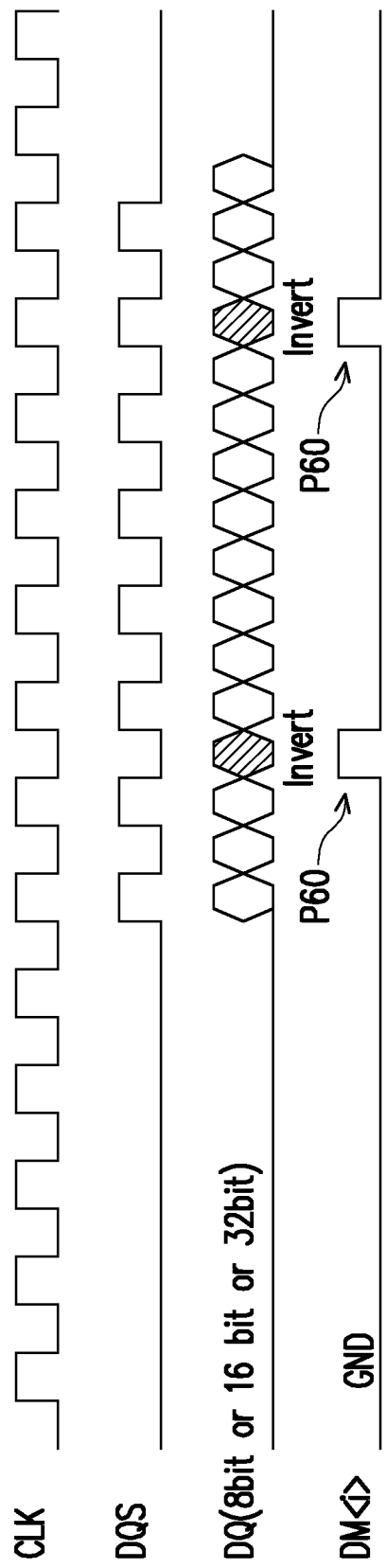
FIG. 6A to FIG. 6B are waveform diagrams illustrating signals in the memory device when data bus inversion algorithm is enabled according to an embodiment of the invention.
Figure 6B:
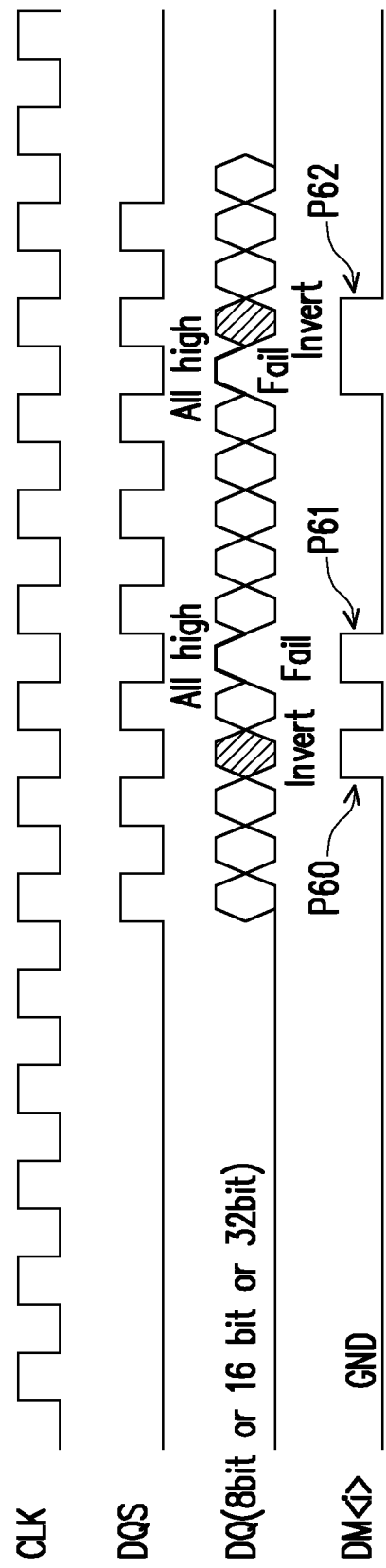

FIG. 6A to FIG. 6B illustrate signal waveforms in the memory device when the DBI algorithm is enabled. Similar to FIG. 5A and FIG. 5B, the illustrated signals include a clock signal CLK, a data output stroke signal DQS, data output signal DQ and the data mask signal DM.

Since the data mask signal DM is also used to indicate the inverted data words by DBI algorithm in a DRAM device, the data mask signal DM alone is not enough to detect the error of the data stored in the target memory array when the DBI algorithm is enabled. Referring to FIG. 6A, even though there is no error in the read data, there are two pulses P60 in the data mask signal DM. These pulses merely indicate that the data words corresponding to these pulses are inverted by the DBI algorithm.

When the DBI algorithm is enabled in the memory device, both of the data mash signal DM and the data output signal DQ are used to detect an error in the data stored in the target memory array. When a pulse is generated in the data mask signal DM, a current data word corresponding to the pulse is determined and the number of bits having a pre-determined logic value (e.g., logic "1") of the current data word is counted. The number of bits having the pre-determined logic value is then compared to a threshold value (e.g., half of the total bit number of the data) to determine whether the current data word has the error. For example, if the number of bits having a pre-determined logic value is greater than or equal to the threshold value, the current data word is determined as an erroneous data word. Otherwise, the current data word is not erroneous.

Referring to FIG. 6B, the data word corresponding to the pulses P61 and P62 has the number of bits having the pre-determined logic value greater than the threshold (e.g., all high bits), thus data word corresponding to the pulses P61 and P62 are erroneous data.

Figure 7:
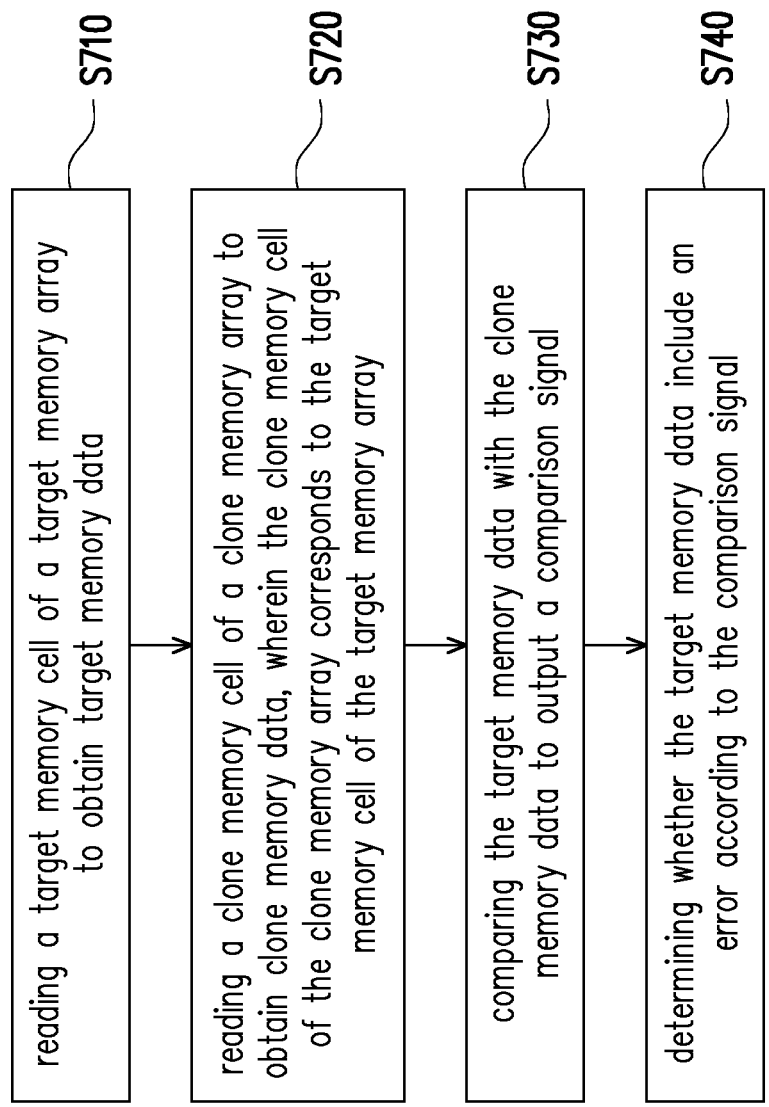
FIG. 7 is a flowchart diagram illustrating an error detection method according to an embodiment of the invention.

Referring to FIG. 7, an error detection method according to an embodiment of the invention is illustrated. In step S710, a target memory cell of a target memory array is read to obtain target memory data. In step S720, a clone memory cell of a clone memory array is read to obtain clone memory data, wherein the clone memory cell of the clone memory array corresponds to the target memory cell of the target memory array. The clone memory cell of the clone memory array and the target memory cell of the target memory array may be activated at the same time, such that the steps S710 and S720 may be performed at the same time.

The target memory data is compared with the clone memory data to output a comparison signal in step S730, and it determines whether the target memory data include an error according to the comparison signal in step S740.

In summary, the embodiments of the invention introduce a memory device having a target memory array and a clone memory array, and an error detection method thereof. The clone memory array stores the same data as the target memory array, and the clone memory array and the target memory array may be located in the same memory bank or in different memory banks. A command that is applied to the target memory array to perform an operation is applied to the clone memory array. To detect an error in the data of the target memory array, the target memory data stored in the target memory array and the clone memory data stored in the clone memory array are read and compared to output a comparison signal. The output comparison signal is used to determine if the error exists.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
a memory array, comprising at least one memory bank that comprises a first memory bank and a second memory bank, wherein the at least one memory bank comprises:
   a target memory array, configured to store data, wherein the target memory array is located in the first memory bank; and
   a clone memory array, corresponds to the target memory array, configured to clone the data stored in the target memory array, wherein the clone memory array is located in the second memory bank; and
a mode register, coupled to the memory array, configured to set a size and a location of the clone memory array, wherein a command that is applied to the target memory array to perform an operation is applied to the clone memory array,
   the command comprises an active command,
   when the active command is applied to a memory cell that is included in the target memory array, the mode register enables the first memory bank and the second memory bank simultaneously, and
   when the active command is applied to a memory cell that is not included in the target memory array, the mode register enables the first memory bank and the mode register does not enable the second memory bank.

2. The memory device of claim 1, further comprising:
a peripheral memory circuitry; and
a memory controller, configured to generate the command to perform the operation on the target memory array and the clone memory array.

3. The memory device of claim 2, wherein
the command comprises a write command for writing memory data to a target memory cell of the target memory array,
in response to receiving the write command, the peripheral memory circuitry writes the memory data into both the target memory cell of the target memory array and a clone memory cell of the clone memory array, wherein the clone memory cell corresponds to the target memory cell.

4. The memory device of claim 2, wherein
the command comprises a read command for reading a target memory cell of the target memory array,
in response to receiving the read command, the peripheral memory circuitry reads the target memory cell of the target memory array and a clone memory cell of the clone memory array to obtain target memory data and clone memory data, wherein the clone memory cell of the clone memory array corresponds to the target memory cell of the target memory array.

5. The memory device of claim 4, further comprising:
a comparator, coupled to the memory array and the peripheral memory circuitry, configured to compare the target memory data with the clone memory data to output a comparison signal, wherein
when the target memory data is the same as the clone memory data, the comparison signal is set in a predetermined level, and
when the target memory data is different from the clone memory data, a pulse is set on the comparison signal.

6. The memory device of claim 5, wherein
when the comparison signal does not include the pulse, the memory controller determines that the target memory data does not include an error; and
when the comparison signal includes the pulses, the memory controller determines that the target memory data includes the error.

7. The memory device of claim 5, wherein
a data bus inversion algorithm is applied to transmit read data through a bus in the memory device, and
the memory controller is further configured to:
   count a number of bits in the target memory data having a predetermined logic value;
   determine whether the number of bits in the target memory data having a predetermined logic value is greater than a threshold value,
   when the number of bits in the target memory data having a predetermined logic value is greater than the threshold value and the comparison signal includes the pulse, the memory controller determines that the target memory data includes an error;
   when the number of bits in the target memory data having a predetermined logic value is not greater than the threshold value or the comparison signal does not include the pulse, the memory controller determines that the target memory data does not include the error.

8. The memory device of claim 4, wherein
the peripheral memory circuitry reads the target memory cell to obtain a first data, wherein a first error correction code operation is performed on the first data to obtain the target memory data, and
the peripheral memory circuitry reads the clone memory cell to obtain a second data, wherein a second error correction code operation is performed on the second data to obtain the clone memory data.

9. An error detection method, adapted to a memory device having at least one memory bank that comprises a target memory array and a clone memory array, the error detection comprising steps of:
reading a target memory cell of the target memory array to obtain target memory data, wherein the target memory array is located in a first memory bank;
reading a clone memory cell of the clone memory array to obtain clone memory data, wherein the clone memory cell of the clone memory array corresponds to the target memory cell of the target memory array, and the clone memory array is located in a second memory bank;
comparing the target memory data with the clone memory data to output a comparison signal;
determining whether the target memory data include an error according to the comparison signal;
receiving an active command;
when the active command is applied to a memory cell that is included in the target memory array, enabling the first memory bank and the second memory bank simultaneously; and
when the active command is applied to a memory cell that is not included in the target memory array, enabling the first memory bank and not enabling the second memory bank.

10. The error detection method of claim 9, wherein the step of comparing the target memory data with the clone memory data to output the comparison signal comprising:
determining whether the target memory data is the same as the clone memory data;
when the target memory data is different from the clone memory data, setting a pulse on the comparison signal; and
when the target memory data is the same as the clone memory data, setting the comparison signal in a predetermined level.

11. The error detection method of claim 10, wherein the step of determining whether the target memory data include the error according to the comparison signal comprises:
when the comparison signal does not include the pulse, determining that the target memory data does not include the error; and
when the comparison signal includes the pulses, determining that the target memory data includes the error.

12. The error detection method of claim 10, wherein
a data bus inversion algorithm is applied to transmit read data through a bus in the memory device, and
the step of determining whether the target memory data include the error according to the comparison signal comprises:
counting a number of bits in the target memory data having a predetermined logic value;
determining whether the number of bits in the target memory data having a predetermined logic value is greater than a threshold value,
when the number of bits in the target memory data having a predetermined logic value is greater than the threshold value and the comparison signal includes the pulse, determining that the target memory data includes the error;
when the number of bits in the target memory data having a predetermined logic value is not greater than the threshold value or the comparison signal does not include the pulse, determining that the target memory data does not include the error.

13. The error detection method of claim 9, wherein reading the target memory cell of the target memory array to obtain the target memory data and reading the clone memory cell of the clone memory array to obtain the clone memory data comprises:
reading the target memory cell to obtain a first data and performing a first error correction code operation on the first data to obtain the target memory cell of the target memory array; and
reading the clone memory cell to obtain a second data and performing a second error correction code operation on the second data to obtain the clone memory data.

14. The error detection method of claim 9, wherein
the memory device further comprises a data output pin and a data mask pin, and
the comparison signal is transmitted to the data mask pin and read data is transmitted to the data output pin.

* * * * *